United States Patent
Song et al.

(10) Patent No.: US 11,518,919 B2
(45) Date of Patent: Dec. 6, 2022

(54) OPTICAL LAMINATE AND IMAGE DISPLAY DEVICE INCLUDING THE SAME

(71) Applicant: DONGWOO FINE-CHEM CO., LTD., Jeollabuk-do (KR)

(72) Inventors: In Kyu Song, Gyeonggi-do (KR); HeeBong Kim, Gyeonggi-do (KR); Min Ho Lim, Seoul (KR); Jun Hee Sung, Incheon (KR); Byung Hoon Song, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 871 days.

(21) Appl. No.: 15/973,657

(22) Filed: May 8, 2018

(65) Prior Publication Data
US 2018/0258332 A1    Sep. 13, 2018

Related U.S. Application Data

(63) Continuation of application No. PCT/KR2016/012941, filed on Nov. 10, 2016.

(30) Foreign Application Priority Data

Nov. 12, 2015 (KR) ........................ 10-2015-0158981

(51) Int. Cl.
*C09J 183/04* (2006.01)
*H01L 51/52* (2006.01)
(Continued)

(52) U.S. Cl.
CPC ............... *C09J 183/04* (2013.01); *B32B 7/12* (2013.01); *B32B 27/08* (2013.01); *C09J 9/00* (2013.01);
(Continued)

(58) Field of Classification Search
CPC .............................. C09J 183/00; C09J 183/04
See application file for complete search history.

(56) References Cited

U.S. PATENT DOCUMENTS

| 2,860,083 | A | * | 11/1958 | Siegfried et al. | ........ | C08L 83/00 |
| | | | | | | 428/323 |
| 3,127,363 | A | * | 3/1964 | Siegfried et al. | ....... | A61F 13/04 |
| | | | | | | 528/34 |

(Continued)

FOREIGN PATENT DOCUMENTS

| CN | 102199403 A | 9/2011 |
| CN | 102791816 A | 11/2012 |

(Continued)

OTHER PUBLICATIONS

International Search Report for PCT/KR2016/012941, (dated 2017).

*Primary Examiner* — Vivian Chen
(74) *Attorney, Agent, or Firm* — The PL Law Group, PLLC

(57) ABSTRACT

An optical laminate includes two substrates each of which has a tensile modulus in a range from 2,000 MPa to 7,500 MPa, and an adhesive layer interposed between the substrates. A storage modulus at 25° C. of the adhesive layer is 100 kPa or less, and a storage modulus at −20° C. of the adhesive layer is equal to or less than three times the storage modulus at 25° C. of the adhesive layer. The optical laminate and an image display device including the optical laminate may have an improved flexible property at various temperature ranges and may be capable of minimizing cracks when being bent.

17 Claims, 3 Drawing Sheets

(51) Int. Cl.

| | |
|---|---|
| *B32B 7/12* | (2006.01) |
| *B32B 27/08* | (2006.01) |
| *C09J 9/00* | (2006.01) |
| *H01L 51/00* | (2006.01) |
| *C08G 77/16* | (2006.01) |
| *C08G 77/04* | (2006.01) |
| *C08L 83/04* | (2006.01) |
| *C08L 83/06* | (2006.01) |
| *C08G 77/14* | (2006.01) |
| *B32B 23/04* | (2006.01) |
| *B32B 27/30* | (2006.01) |
| *B32B 27/34* | (2006.01) |
| *B32B 27/40* | (2006.01) |
| *B32B 27/36* | (2006.01) |
| *B32B 27/38* | (2006.01) |
| *B32B 27/28* | (2006.01) |
| *B32B 27/32* | (2006.01) |
| *H01L 27/32* | (2006.01) |

(52) U.S. Cl.
CPC .......... *H01L 51/5253* (2013.01); *B32B 23/04* (2013.01); *B32B 27/28* (2013.01); *B32B 27/30* (2013.01); *B32B 27/32* (2013.01); *B32B 27/34* (2013.01); *B32B 27/36* (2013.01); *B32B 27/365* (2013.01); *B32B 27/38* (2013.01); *B32B 27/40* (2013.01); *B32B 2250/03* (2013.01); *B32B 2250/04* (2013.01); *B32B 2250/05* (2013.01); *B32B 2250/40* (2013.01); *B32B 2307/40* (2013.01); *B32B 2307/51* (2013.01); *B32B 2457/20* (2013.01); *B32B 2457/206* (2013.01); *B32B 2457/208* (2013.01); *C08G 77/04* (2013.01); *C08G 77/14* (2013.01); *C08G 77/16* (2013.01); *C08L 83/04* (2013.01); *C08L 83/06* (2013.01); *C08L 2205/02* (2013.01); *H01L 27/323* (2013.01); *H01L 27/3232* (2013.01); *H01L 51/0097* (2013.01); *H01L 51/5281* (2013.01)

(56) References Cited

U.S. PATENT DOCUMENTS

| | | | |
|---|---|---|---|
| 5,110,882 A | * | 5/1992 | Hamada .................. C09J 183/04 528/31 |
| 10,829,671 B2 | * | 11/2020 | Cho ........................ C09J 133/08 |
| 2006/0127606 A1 | | 6/2006 | Ogasawara et al. |
| 2006/0159867 A1 | * | 7/2006 | O'Donnell ........ G02F 1/133308 349/56 |
| 2010/0098886 A1 | * | 4/2010 | Fong .................. C09K 19/0208 428/1.6 |
| 2011/0256666 A1 | * | 10/2011 | Sugo ...................... B23K 26/40 428/343 |
| 2013/0065983 A1 | * | 3/2013 | Ono ........................ C08L 83/08 522/172 |
| 2014/0088232 A1 | * | 3/2014 | Mochizuki .............. C08L 83/00 524/261 |
| 2016/0122600 A1 | * | 5/2016 | Moon ......................... C09J 7/22 428/354 |
| 2016/0177146 A1 | * | 6/2016 | Mun ..................... C09J 133/08 428/220 |
| 2017/0002237 A1 | * | 1/2017 | Cho ............................ C09J 133/08 |
| 2017/0349791 A1 | * | 12/2017 | Lee ............................. C09J 4/00 |

FOREIGN PATENT DOCUMENTS

| | | | |
|---|---|---|---|
| CN | 104871653 A | | 8/2015 |
| JP | 2003-315554 A | | 11/2003 |
| JP | 2007-112988 A | | 5/2007 |
| JP | 2008-032852 A | | 2/2008 |
| JP | 2010-039458 A | | 2/2010 |
| JP | 2013-011853 A | | 1/2013 |
| JP | 2013-063606 A | | 4/2013 |
| JP | 2013068942 A | | 4/2013 |
| KR | 10-1314489 B1 | | 10/2013 |
| KR | 10-2015-0052641 A | | 5/2015 |
| KR | 2016-0129219 A | * | 11/2016 |
| KR | 20160129219 A | * | 11/2016 |
| WO | WO 2016/104979 A | * | 6/2016 |

* cited by examiner

OPTICAL LAMINATE AND IMAGE DISPLAY DEVICE INCLUDING THE SAME

CROSS REFERENCE TO RELATED APPLICATIONS AND CLAIM OF PRIORITY

The present application is a continuation application to International Application No. PCT/KR2016/012941 with an International Filing Date of Nov. 10, 2016, which claims the benefit of Korean Patent Application No. 10-2015-0158981 filed on Nov. 12, 2015 at the Korean Intellectual Property Office, the disclosures of which are incorporated by reference herein in their entirety.

BACKGROUND

1. Field

The present invention relates to an optical laminate and an image display device including the same.

2. Description of the Related Art

As semiconductor technologies are being rapidly developed, a size of a flat panel display device becomes greater while a weight of the flat panel display device becomes smaller. Demands of the flat panel display device having various functional improvements are increasing.

The flat panel display device includes a liquid crystal display (LCD) device, a plasma display panel (PDP) device, a field emission display (FED) device, an electroluminescence display (ELD) device, an electrophoresis display (EPD) device, an organic light emitting diode (OLED) device, etc.

Recently, a flexible display device including a substrate formed of a flexible material and capable of being bent like a paper while maintaining display property is highlighted.

However, when the flexible display device is repeatedly or excessively bent, a display element such as a thin film transistor may be damaged or a short-circuit of a conductive wiring may occur.

Korean Patent Publication No. 2015-0052641 discloses a flexible and curved display device, however, fails to solutions to the above-mentioned problems.

SUMMARY

An aspect of the present invention provides an optical laminate having improved flexible property and capable of reducing cracks while being bent.

The above aspect of the present invention will be achieved by the following technical features:

(1) An optical laminate, comprising two substrates each of which has a tensile modulus in a range from 2,000 MPa to 7,500 MPa; and an adhesive layer interposed between the substrates, wherein a storage modulus at 25° C. of the adhesive layer is 100 kPa or less, and a storage modulus at −20° C. of the adhesive layer is equal to or less than three times the storage modulus at 25° C. of the adhesive layer.

(2) The optical laminate according to the above (1), wherein a thickness of the adhesive layer is in a range from 10 to 200 μm.

(3) The optical laminate according to the above (1), further comprising a second substrate formed on an outer surface of at least one of the substrates, wherein a tensile modulus of the second substrate is in a range from 2,000 MPa to 7,500 MPa.

(4) The optical laminate according to the above (3), further comprising a second adhesive layer between the second substrate and the substrate.

(5) The optical laminate according to the above (4), wherein a storage modulus at 25° C. of the second adhesive layer is 100 kPa or less, and a storage modulus at −20° C. of the second adhesive layer is equal to or less than three times the storage modulus at 25° C. of the second adhesive layer.

(6) The optical laminate according to the above (4), further comprising an additional substrate formed on the substrate or on the second substrate, wherein a tensile modulus of the additional substrate is in a range from 2,000 MPa to 7,500 MPa.

(7) The optical laminate according to the above (1), wherein the substrate is selected from a group consisting of a polarizing plate, a window substrate, a touch sensor, a polarizing plate-integrated touch sensor and an OLED device layer.

(8) An image display device comprising the optical laminate according to any one of the above (1) to (7).

The optical laminate accord to the present invention may have improved flexible property, particularly at various temperatures so that cracks may be prevented while being bent. Thus, the optical laminate may be effectively applied to a flexible display device.

DETAILED DESCRIPTION

Figure 1:
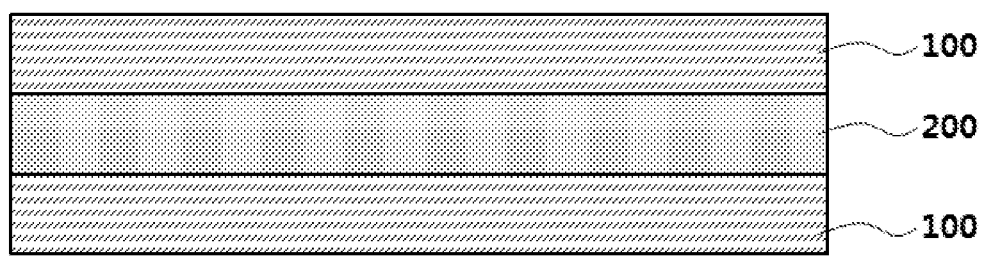
FIG. 1 is a schematic cross-sectional view illustrating an optical laminate in accordance with an exemplary embodiment.

The present invention relates to an optical laminate including two substrates and an adhesive layer interposed therebetween, and an image display device including the same. Each substrate has a tensile modulus ranging from 2,000 MP to 7,500 MPa, a storage modulus of the adhesive layer at 25° C. is 100 kPa or less and a storage modulus of the adhesive layer at −20° C. is smaller than or equal to three times the storage modulus of the adhesive layer at 25° C. so that the optical laminate may have improved flexible property and cracks may be minimized.

Hereinafter, detailed descriptions of exemplary embodiments of the present invention will be provided.

The optical laminate includes two substrates 100 and an adhesive layer 200 interposed therebetween.

According to an embodiment of the present invention, a tensile modulus of the substrate 100 is in a range from 2,000 MPa to 7,500 MPa. Within this range, an improved flexible property may be obtained while being used together with the adhesive layer 200. If the tensile modulus is less than 2,000 MPa, a restoration after bending may not occur. If the tensile modulus exceeds 7,500 MPa, the adhesive layer 200 may not sufficiently alleviate a stress generated when being bent due to excessive strength to cause cracks. The tensile modulus may be adjusted by controlling a thickness, a resin type, a curing degree, a molecular weight, etc., of the substrate 100.

The substrate 100 may include a material having a tensile modulus of the above range without a specific limitation. For example, the substrate 100 may include a polyester-based film such as polyethylene terephthalate, polyethylene isophthalate, polybutylene terephthalate, etc.; a cellulose-based film such as diacetyl cellulose, triacetyl cellulose, etc.; a polycarbonate-based film; an acryl-based film such as polymethyl(meth)acrylate, polyethyl(meth)acrylate, etc.; a styrene-based film such as polystyrene, acrylonitrile-styrene copolymer; a polyolefin-based film such as cycloolefin, cycloolefin copolymer, polynorbomene, polypropylene, polyethylene, ethylene-propylene copolymer, etc.; a polyvinylchloride-based film; a polyamide-based film such as nylon, aromatic polyamide; an imide-based film; a sulfone-based film; a polyetherketone-based film; a polyphenylene sulfide-based film; a vinyl alcohol-based film; a vinylidene chloride-based film; a vinyl butyral-based film; an allylate-based film; a polyoxymethylene-based film; an urethane-based film; an epoxy-based film; a silicon-based film, or the like.

The substrate 100 may include the film treated by stretching, dyeing, cross-linking, layer-forming, and may include a plurality of films within the above tensile modulus range. For example, the substrate 100 may include a polarizing plate, a window substrate, a touch sensor, a polarizing plate-integrated touch sensor, an OLED device layer, etc. In the polarizing plate-integrated touch sensor, a sensing electrode layer may be formed on at least one surface of the polarizing plate. The OLED device layer may include a substrate, and an anode, a cathode, an electrode transport layer, a hole transport layer, an emitting layer, etc., formed on the substrate.

A thickness of the substrate 100 may be properly adjusted within the above tensile modulus range. For example, the thickness of the substrate 100 may be in a range from 10 μm to about 200 μm.

The adhesive layer 200 is interposed between the two substrates 100 to attach the substrates 100 to each other.

According to an embodiment of the present invention, a storage modulus at 25° C. of the adhesive layer 200 is 100 kPa or less.

The storage modulus at 25° C. is a storage modulus measured under a condition of 25° C. When the adhesive layer 200 having the storage modulus at 25° C. of 100 kPa or less is used together with the substrates 100 having the above tensile modulus range, a stress when being bent may be alleviated to reduce cracks. For example, the storage modulus at 25° C. is in a range from 10 kPa to 100 kPa, An image display device may be used in various environment, and thus improved flexible property is needed at a room temperature and also at a lower temperature. Accordingly, an evaluation of bending cracks in the optical laminate applied to the image display device is commonly conducted at a low temperature (e.g., −20° C.). Thus, in an embodiment of the present invention, a storage modulus at −20° C. of the adhesive layer 200 is equal to or less than three times the storage modulus at 25° C. of the adhesive layer 200 so that the optical laminate including the substrate 100 and the adhesive layer 200 may have improved flexible property at the low temperature.

The adhesive layer 200 according to an embodiment of the present invention may include an optical transparent adhesive commonly used in the art which satisfies the above storage modulus range.

For example, a (meth)acryl-based adhesive, an ethylene/acetic acid vinyl copolymer adhesive, a silicon-based adhesive, a polyurethane-based adhesive, a natural rubber-based adhesive, a styrene-isoprene-styrene block copolymer-based adhesive, etc., may be used.

More particularly, the silicon-based adhesive including a copolymer of a silicon-based resin and a silicon resin.

For example, polydimethylsiloxane represented by Chemical Formula 1 below may be used as the silicon-based resin.

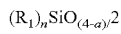  [Chemical Formula 1]

In the above formula, $R_1$ is a C1-C6 alkyl group, a C3-C8 cycloalkyl group, a C2-C10 alkenyl group or a C6-C18 aryl group, and a is 1.8 to 2.1.

In Chemical Formula 1, if a is less than 1.8, a gelation may easily occur. If a is greater than 2.1, a raw rubber phase may be caused.

A polymerization degree of the silicon-based resin may be in range from 100 to 10,000, and a terminal of the silicon-based resin may be capped by a hydroxyl group, a vinyl group, etc.

For example, the silicon resin may be represented by Chemical Formula 2 below.

  [Chemical Formula 2]

In the above formula, $R_2$ is a C1-C6 alkyl group, a C3-C8 cycloalkyl group, a C2-C10 alkenyl group or a C6-C18 aryl group.

A molar ratio of the silicon-based resin and the silicon resin is not be specifically limited, and may be, for example, from 0.5:1 to 1:1 from an aspect of improving adhesiveness.

The silicon-based adhesive may be prepared by, e.g., an alkali-catalyst reaction. The alkali-catalyst may include sodium hydroxide, potassium hydroxide, etc., and may be included in an amount from 5 ppm to 10 ppm based on a total siloxane weight. A reaction solvent may include, e.g., toluene, xylene, etc.

A method of controlling the storage modulus at 25° C. and the ratio of the storage modulus of 25° C. and −20° C. in the adhesive layer 200 is not be specifically limited. For example, a ratio of monomer having a low glass transition temperature (e.g., −40° C. or less) among a total monomer may be increased, or a ratio of a low functionality resin (e.g., 3 or less) among a total resin may be increased.

A thickness of the adhesive layer 200 may not be specifically limited within the above storage modulus range. For example, the thickness of the adhesive layer 200 may be in a range from 10 μm to 200 μm. If the thickness of the adhesive layer 200 is less than 10 μm, a sufficient adhesiveness may not be provided to cause reliability degradation such as a bubble generation. If the thickness of the adhesive layer 200 exceeds 200 μm, a bending property may be deteriorated due to a thickness increase to cause bending cracks.

Figure 2:
FIG. 2 is a schematic cross-sectional view illustrating an optical laminate in accordance with an exemplary embodiment.

As illustrated in FIG. 2, the optical laminate of an embodiment of the present invention may further include an additional substrate 300 that has a tensile modulus ranging from 2,000 MPa to 7,500 MPa on an outer surface of at least one substrate 100.

The additional substrate 300 may be stacked on the outer surface of one substrate 100 or on the outer surfaces of both substrates 100. FIG. 2 illustrates that the additional substrate 300 is formed on the outer surface of the one substrate 100, but the present invention is not limited to the structure of FIG. 2.

In the optical laminate of an embodiment of the present invention, the adhesive layer having the specific storage modulus may prevent the cracks of the substrates 100 having the specific tensile modulus so that improved flexible property may be maintained even though the additional substrate 300 may be included.

The additional substrate 300 may include the above-mentioned film or the additionally treated film. For example, the additional substrate 300 may include a polarizing plate, a window substrate, a touch sensor, a polarizing plate-integrated touch sensor, an OLED device, etc.

The additional substrate 300 may be integrally formed with the one substrate 100 or individually attached.

For example, when the additional substrate 300 is integrally formed with the substrate 100, the additional substrate 300 may be coated on the substrate 100. For example, if the additional substrate 300 is a film, a film forming composition may be coated on the substrate 100 to form the additional substrate 300. Alternatively, an integral substrate coated on the additional substrate 300 may be initially used as the substrate 100. Particularly, a coating polarizing plate coated on a window substrate (the additional substrate) may be used as the substrate 100.

When the additional substrate 300 is individually attached on the substrate 100, the additional substrate 300 may be attached using an adhesive commonly known in the art.

Figure 3:
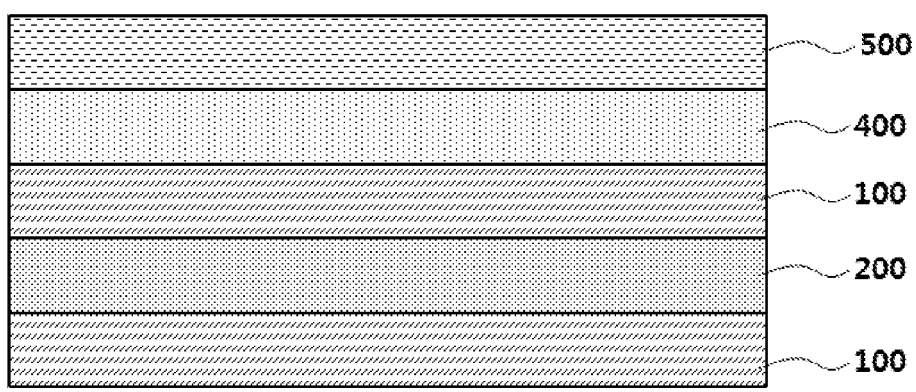
FIG. 3 is a schematic cross-sectional view illustrating an optical laminate in accordance with an exemplary embodiment.

As illustrated in FIG. 3, the optical laminate may further include a second adhesive layer 400 stacked on an outer surface of at least one substrate 100, and a second substrate 500 attached to the second adhesive layer 400.

The second adhesive layer 400 and the second substrate 500 may be stacked on the outer surface of one substrate 100 or on the outer surfaces of both substrates 100. FIG. 3 illustrates that the second adhesive layer 400 and the second substrate 500 are formed on the outer surface of the one substrate 100, but the present invention is not limited to the structure of FIG. 3.

The second substrate 500 may be an element widely used in the image display device, and may include, e.g., a polarizing plate, a window substrate, a touch sensor, a polarizing plate-integrated touch sensor, an OLED device layer, etc. The second substrate 500 may be attached by the adhesive layer 200 formed on the outer surface of at least one substrate 100.

A tensile modulus of the second substrate 500 may be in a range from 2,000 MPa to 7,500 MPa. A storage modulus at 25° C. of the second adhesive layer 400 may be 100 kPa or less. A storage modulus at −20° C. of the second adhesive layer 400 may be equal to or less than three times storage modulus at 25° C. of the second adhesive layer 400. In this case, the improvement of flexible property and the prevention of cracks may be realized as described above.

Figure 4:
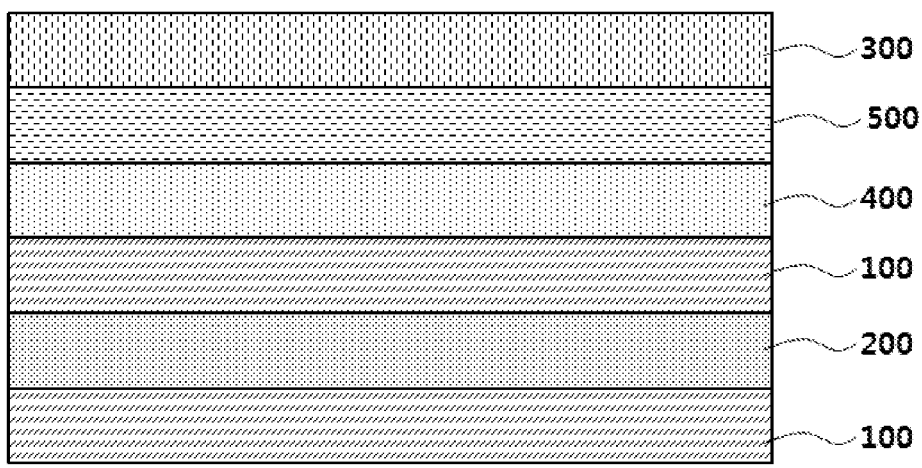
FIG. 4 is a schematic cross-sectional view illustrating an optical laminate in accordance with an exemplary embodiment.

As illustrated in FIG. 4, the optical laminate according to an embodiment of the present invention may further include the additional substrate 300 having a tensile modulus from 2,000 MPa to 7,500 MPa on the substrate 100 or the second substrate 500.

An embodiment of the present invention also provides an image display device including the optical laminate.

The optical laminate according to an embodiment of the present invention may be applied to a conventional liquid display device as well as an electroluminescent display device, a plasma display device, a field emission display device, etc.

Hereinafter, exemplary embodiments will be described to more concretely understand the present invention with reference to examples. However, it will be apparent to those skilled in the art that such embodiments are provided for illustrative purposes and various modifications and alterations may be possible without departing from the scope and spirit of the present invention, and such modifications and alterations are duly included in the present invention as defined by the appended claims.

Example 1

A triacetyl cellulose protective film having a thickness of 20 μm was attached on both faces of a polyvinyl alcohol-based polarizer having a thickness of 25 μm to prepare a polarizing plate (tensile modulus: 5,000 MPa), and a window substrate (tensile modulus: 5,000 MPa) having a thickness of 100 μm was prepared. An adhesive layer having a thickness of 25 μm was formed using an adhesive composition to attach the polarizing plate and the window substrate to each other.

Figure 5:
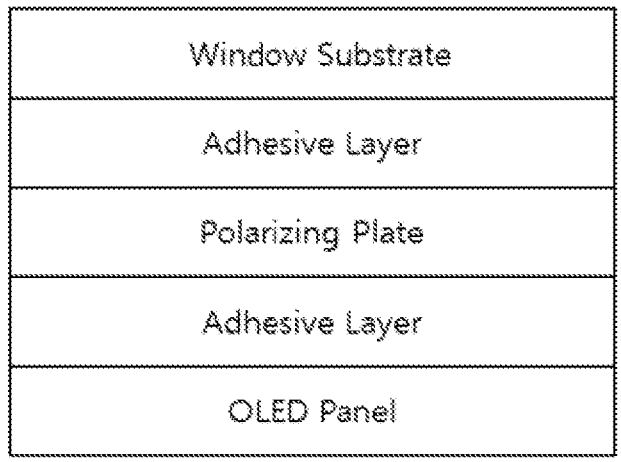
FIG. 5 is a schematic cross-sectional view illustrating an optical laminate in accordance with an exemplary embodiment.

Subsequently, an adhesive layer was additionally formed on the polarizing plate, and an OLED panel (tensile modulus: 5,000 MPa) having a thickness of 100 μm was attached to the adhesive layer to obtain an optical laminate as illustrated in FIG. 5.

In the adhesive composition, 100 g of polydimethylsiloxane terminated with a hydroxyl group and having an average polymerization degree of 6,000, and 110 g of polymethylsiloxane composed of $(CH_3)_3SiO_{1/2}$ unit 0.8 mol and $SiO_2$ unit 1.0 mol were dissolved in toluene 140 g. 5 ppm of 10% sodium hydroxide solution based on a total siloxane weight was added and heat-fluxed for 6 hours, and then 10 ppm of 10% phosphoric acid/isopropanol solution based on the total siloxane weight was added and neutralized to form a transparent colorless composition solution having a solid content of 60% and a viscosity 110000 cSt. Tetrabutyl titanate 10 g and chloroplatinic acid 10 g in 2% ethyl hexanol solution were added to 100 g of the above composition solution.

Example 2

An optical laminate was formed by a method the same as that of Example 1 except that a thickness of the adhesive layer was changed.

Example 3

An optical laminate was formed by a method the same as that of Example 1 except that a thickness of the adhesive layer was changed.

Example 4

An optical laminate was formed by a method the same as that of Example 1 except that an adhesive composition including 140 g of polymethylsiloxane was used.

Example 5

Figure 6:
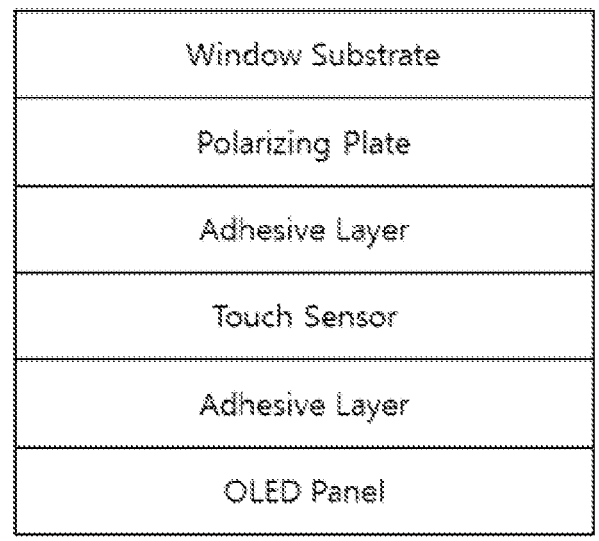
FIG. 6 is a schematic cross-sectional view illustrating an optical laminate in accordance with an exemplary embodiment.

A touch sensor (tensile modulus: 4,500 MPa) having a thickness of 30 μm which included an ITO transparent electrode layer formed on a polycarbonate film was prepared. The touch sensor and the polarizing plate of Example 1 was attached to each other using the adhesive layer the same as that of Example 1, and the window substrate of Example 1 was attached on the polarizing plate. The OLED panel of Example 1 was attached to the touch sensor using the adhesive layer to obtain an optical laminate having a structure as illustrated in FIG. 6.

Comparative Example 1

An optical laminate was formed by a method the same as that of Example 4 except that 50 g of silica particles was added to the adhesive composition used in Example 4 and a thickness of the adhesive layer was changed.

Comparative Example 2

An optical laminate was formed by a method the same as that of Example 1 except that 50 g of silica particles was added to the adhesive composition used in Example 1 and a thickness of the adhesive layer was changed.

Comparative Example 3

An optical laminate was formed by a method the same as that of Example 5 except that the adhesive composition of Comparative Example 1 was used and a thickness of the adhesive layer was changed.

Comparative Example 4

An optical laminate was formed by a method the same as that of Comparative Example 1 except that a polarizing plate (tensile modulus: 7,000 MPa) including a polyvinyl alcohol polarizer having a thickness of 25 µm and a polycarbonate protective film having a thickness of 20 µm formed on both faces of the polarizer was used.

Comparative Example 5

An optical laminate was formed by a method the same as that of Comparative Example 1 except that an OLED panel (tensile modulus: 6,500 MPa) having a thickness of 30 µm was used.

Comparative Example 6

An optical laminate was formed by a method the same as that of Example 1 except that a polarizing plate (tensile modulus: 7,700 MPa) including a polyvinyl alcohol polarizer having a thickness of 25 µm and a polyethylene terephthalate protective film having a thickness of 25 µm formed on both faces of the polarizer was used.

Comparative Example 7

An optical laminate was formed by a method the same as that of Example 1 except that an OLED panel (tensile modulus: 8,100 MPa) having a thickness of 30 µm was used.

Experimental Example

1. Measurement of Modulus

A storage modulus of an adhesive layer was measured using a viscoelasticity measuring device (MCR-301, Anton Paar) at −20° C. and 25° C. More particularly, an adhesive layer sample having a size 30 mm (length)×30 mm (width) was prepared. The sample was combined with a glass plate, and then attached to a measuring tip. In this state, the storage modulus was measured under conditions of a frequency 1.0 Hz, a transformation 2% and a heating rate 5° C./min at −20° C. and 25° C. The results are shown in Table 1 below.

A tensile modulus of a substrate was measured using a universal testing machine (Autograph AG-I, Shimadzu Corporation) with a sample size of 100 mm (length)×40 mm (width). The tensional test was performed at a measuring temperature of 25° C. and a tensional speed of 4 mm/min.

2. Evaluation of Cracks

Crack evaluation was conducted using a folding tester (DLDMLH-FS, YUASA Corporation). The tester was equipped with a sample having a size of 100 mm×10 mm, and 200,000 cycles of test were conducted under a condition of 2R and a rate of 50 cycles/min.

TABLE 1

| | Thickness of Adhesive Layer (µm) | Storage Modulus of Adhesive Layer (kPa) | | (2)/(1) | Crack Generation | |
|---|---|---|---|---|---|---|
| | | 25° C. (1) | −20° C. (2) | | 25° C. | −20° C. |
| Example 1 | 25 | 64 | 88 | 1.4 | No Cracks | No Cracks |
| Example 2 | 50 | 64 | 98 | 1.5 | No Cracks | No Cracks |
| Example 3 | 100 | 73 | 127 | 1.7 | No Cracks | No Cracks |
| Example 4 | 25 | 77 | 167 | 2.2 | No Cracks | No Cracks |
| Example 5 | 25 | 64 | 88 | 1.4 | No Cracks | No Cracks |
| Comparative Example 1 | 50 | 115 | 3982 | 34.6 | Cracks Occurred | Cracks Occurred |
| Comparative Example 2 | 50 | 84 | 4053 | 48.3 | No Cracks | Cracks Occurred |
| Comparative Example 3 | 50 | 115 | 3982 | 34.6 | Cracks Occurred | Cracks Occurred |
| Comparative Example 4 | 50 | 115 | 3982 | 34.6 | Cracks Occurred | Cracks Occurred |
| Comparative Example 5 | 50 | 115 | 3982 | 34.6 | Cracks Occurred | Cracks Occurred |
| Comparative Example 6 | 25 | 64 | 88 | 1.4 | Cracks Occurred | Cracks Occurred |
| Comparative Example 7 | 25 | 64 | 88 | 1.4 | Cracks Occurred | Cracks Occurred |

Referring to Table 1, the optical laminates of Examples having the storage modulus and the tensile modulus within the ranges of the present invention did not show cracks when being bent at a room temperature and a low temperature.

However, cracks were generated in the optical laminates of Comparative Examples beyond the modulus ranges of the present invention.

What is claimed is:

1. An optical laminate, comprising:
two substrates facing each other, each of the two substrates having a tensile modulus in a range from 2,000 MPa to 7,500 MPa; and
an adhesive layer comprising silicon-based adhesive interposed between the two substrates, the silicon-based adhesive comprising a copolymer of a silicon-based resin represented by Chemical Formula 1 and a silicon resin represented by Chemical Formula 2:

$$(R_1)_a SiO_{(4-a)/2}$$ [Chemical Formula 1]

wherein R1 is a C1-C6 alkyl group, and a is 1.8 to 2.1;

$$(R2)_3 SiO_{1/2}$$ [Chemical Formula 2]

wherein R2 is a C1-C6 alkyl group,
wherein a molar ratio of the silicon-based resin and the silicon resin is from 0.5:1 to 1:1,
wherein a storage modulus at 25° C. of the adhesive layer is 100 kPa or less, and a ratio of a storage modulus at −20° C. of the adhesive layer relative to the storage modulus at 25° C. of the adhesive layer is in a range from 1.4 to 2.2.

2. The optical laminate of claim 1, wherein a thickness of the adhesive layer is in a range from 10 μm to 200 μm.

3. The optical laminate of claim 1, further comprising a second substrate formed on an outer surface of at least one of the two substrates,
wherein a tensile modulus of the second substrate is in a range from 2,000 MPa to 7,500 MPa.

4. The optical laminate of claim 3, wherein the second substrate is formed on the outer surface of one of the two substrates.

5. The optical laminate of claim 3, wherein the second substrate is formed on the outer surfaces of both of the two substrates.

6. The optical laminate of claim 3, further comprising a second adhesive layer between the second substrate and the at least one of the two substrates.

7. The optical laminate of claim 6, wherein a storage modulus at 25° C. of the second adhesive layer is 100 kPa or less, and a storage modulus at −20° C. of the second adhesive layer is equal to or less than three times the storage modulus at $25^{rc}$ of the second adhesive layer.

8. The optical laminate of claim 6, further comprising an additional substrate formed on at least one of the two substrates or on the second substrate,
wherein a tensile modulus of the additional substrate is in a range from 2,000 MPa to 7,500 MPa.

9. The optical laminate of claim 8, wherein the additional substrate is formed on the outer surface of one of the two substrates.

10. The optical laminate of claim 8, wherein the additional substrate is formed on the outer surfaces of both of the two substrates.

11. The optical laminate of claim 8, wherein the additional substrate is formed on the second substrate.

12. The optical laminate of claim 8, wherein the additional substrate is selected from the group consisting of a polarizing plate, a window substrate, a touch sensor, a polarizing plate-integrated touch sensor and an OLED device.

13. The optical laminate of claim 8, wherein the additional substrate is integrally formed with the at least one of the two substrates.

14. The optical laminate of claim 1, wherein the two substrates are each selected from the group consisting of a polarizing plate, a window substrate, a touch sensor, a polarizing plate-integrated touch sensor and an OLED device layer.

15. The optical laminate of claim 1, wherein the two substrates are each a polyester-based film, a cellulose-based film, a polycarbonate-based film, an acryl-based film, a styrene-based film, a polyolefin-based film, a polyvinylchloride-based film, a polyamide-based film, an imide-based film, a sulfone-based film, a polyetherketone-based film, a polyphenylene sulfide-based film, a vinyl alcohol-based film, a vinylidene chloride-based film, a vinyl butyral-based film, an allylate-based film, a polyoxymethylene-based film, an urethane-based film, an epoxy-based film, or a silicon-based film.

16. An image display device comprising the optical laminate of claim 1.

17. The optical laminate of claim 1, wherein the two substrates comprise materials independently selected from the group consisting of a polyester-based film, a cellulose-based film, a polycarbonate-based film, an acryl-based film, a styrene-based film, a polyolefin-based film, a polyvinylchloride-based film, a polyamide-based film, an imide-based film, a sulfone-based film, a polyetherketone-based film, a polyphenylene sulfide-based film, a vinyl alcohol-based film, a vinylidene chloride-based film, a vinyl butyral-based film, an allylate-based film, a polyoxymethylene-based film, an urethane-based film, an epoxy-based film, or a silicon-based film.

* * * * *